(12) United States Patent
Chen et al.

(10) Patent No.: US 6,861,315 B1
(45) Date of Patent: Mar. 1, 2005

(54) METHOD OF MANUFACTURING AN ARRAY OF BI-DIRECTIONAL NONVOLATILE MEMORY CELLS

(75) Inventors: Bomy Chen, Cupertino, CA (US); Sohrab Kianian, Los Altos Hills, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 35 days.

(21) Appl. No.: 10/641,432

(22) Filed: Aug. 14, 2003

(51) Int. Cl.[7] .......................................... H01L 21/8247
(52) U.S. Cl. ....................................................... 438/259
(58) Field of Search ................................. 438/257–267

(56) References Cited

U.S. PATENT DOCUMENTS

| | | | |
|---|---|---|---|
| 5,021,999 A | 6/1991 | Kohda et al. | |
| 5,029,130 A | 7/1991 | Yeh | |
| 5,768,192 A | 6/1998 | Eitan | |
| 6,002,152 A | 12/1999 | Guterman et al. | |
| 6,011,725 A | 1/2000 | Eitan | |
| 6,093,945 A | 7/2000 | Yang | |
| 6,103,573 A | 8/2000 | Harari et al. | |
| 6,281,545 B1 | 8/2001 | Liang et al. | |
| 6,329,685 B1 | 12/2001 | Lee | |
| 6,420,231 B1 | 7/2002 | Harari et al. | |
| 6,426,896 B1 | 7/2002 | Chen | |
| 6,597,036 B1 | 7/2003 | Lee et al. | |
| 2002/0056870 A1 | 5/2002 | Lee et al. | |
| 2002/0163031 A1 | 11/2002 | Lee et al. | |
| 2004/0197997 A1 * | 10/2004 | Lee et al. | ................... 438/259 |

OTHER PUBLICATIONS

IEEE, 2002, entitled "Quantum–well Memory Device (QW/MD) With Extremely Good Charge Retention," Z. Krivokapic, et al. (4 pages).

Hayashi et al., "A Self–Aligned Split–Gate Flash EEPROM Cell With 3–D Pillar Structure," pp. 87–88, 1999 Symposium on VLSI Technology Digest Of Technical Papers, Center for Integrated Systems, Standford University, Stanford, CA 94305, USA.

* cited by examiner

Primary Examiner—Richard A. Booth
(74) Attorney, Agent, or Firm—DLA Piper Rudnick Gray Cary US LLP

(57) ABSTRACT

A method of making an array of bi-directional non-volatile memory cells in a substrate of a substantially single crystalline semiconductive material, where the material has a first conductivity type with the substrate having a substantially planar surface, comprises forming a plurality of spaced apart substantially parallel trenches in a first direction in the planar surface. Each of the trenches has a sidewall and a bottom. A region of a second conductivity type is formed in the bottom of each trench. A floating gate is formed in each trench insulated and spaced apart from the sidewall of the trench. The floating gate has a first end near the bottom and a second end furthest away from the bottom. A layer of tunneling oxide is formed about the second end of each floating gate. A layer of word region is formed on the layer of tunneling oxide. The layer of word region extends in a second direction substantially perpendicular to the first direction. The layer of word region is cut into a plurality of strips in the second direction to form a plurality of spaced apart word lines. Each strip is spaced apart from one another and substantially parallel to one another, and cuts through the floating gate in each of the trenches. Electrical connections are made to each of the region of second conductivity type and each of the plurality of spaced apart word lines.

6 Claims, 5 Drawing Sheets

METHOD OF MANUFACTURING AN ARRAY OF BI-DIRECTIONAL NONVOLATILE MEMORY CELLS

TECHNICAL FIELD

The present invention relates to a method of manufacturing an array of bi-directional nonvolatile memory cells using a floating gate for storage of charges.

BACKGROUND OF THE INVENTION

Nonvolatile memory cells have a floating gate for the storage of charges thereon to control the conduction of current in a channel in a substrate of a semiconductive material is well known in the art. See, for example, U.S. Pat. No. 5,029,130 whose disclosure is incorporated herein by reference in its entirety. In U.S. Pat. No. 5,029,130, a split gate nonvolatile memory cell having a floating gate with source side injection and poly to poly tunneling is disclosed. The memory cell has a first region and a second region with a channel region therebetween with the channel region having a first portion and a second portion. A floating gate is disposed over a first portion of the channel region is insulated therefrom and controls the conduction of current in the channel region depending upon the charges stored in the floating gate. A word line/erase gate is disposed over a second portion of the channel region and is insulated therefrom and controls the conduction of current in the second portion of the channel region. The cell is programmed when electrons through the mechanism of hot electron channel injection are injected from the channel region onto the floating gate. The cell is erased by electrons from the floating gate tunneling to the erase gate through the mechanism of Fowler-Nordheim tunneling. The floating gate is characterized by having a sharp tip to facilitate the tunneling of electrons from the floating gate to the control gate. In U.S. Pat. No. 5,029,130, the control gate/erase gate performs two functions. First, it controls the conduction of current in the second portion of the channel region during the operations of programming and read. Secondly, it is supplied with a high voltage during the erase operation to attract the electrons from the spaced apart and insulated floating gate. These two functions have compromised the design of a single member which must perform both functions. Specifically, during programming and read, the word line/control gate receives low voltage whereas during erase, it must receive a high voltage.

Bidirectional non-volatile memory cells using trapping charge materials are well known in the art. See, for example, U.S. Pat. Nos. 5,768,192 and 6,011,725.

It is therefore, an object of the present invention to overcome this and other difficulties.

SUMMARY OF THE INVENTION

The present invention relates to a method of forming an array of bi-directional non-volatile memory cells in a substrate of a substantially single crystalline semiconductive material. The material has a first conductivity type with the substrate having a substantially planar surface. The method comprises forming a plurality of spaced apart substantially parallel trenches in a first direction in the planar surface. Each of the trenches has a sidewall and a bottom. A region of a second conductivity type is formed in the bottom of each trench. A floating gate is formed in each trench insulated and spaced apart from the sidewall of the trench. The floating gate has a first end near the bottom and a second end furthest away from the bottom. A layer of tunneling oxide is formed about the second end of each floating gate. A layer of word region is formed on the layer of tunneling oxide. The layer of word region extends in a second direction substantially perpendicular to the first direction. The layer of word region is cut into a plurality of strips in the second direction to form a plurality of spaced apart word lines. Each strip is spaced apart from one another and substantially parallel to one another, and cuts through the floating gate in each of the trenches. Electrical connections are made to each of the region of second conductivity type and each of the plurality of spaced apart word lines.

DETAILED DESCRIPTION OF THE INVENTION

Figure 1A:
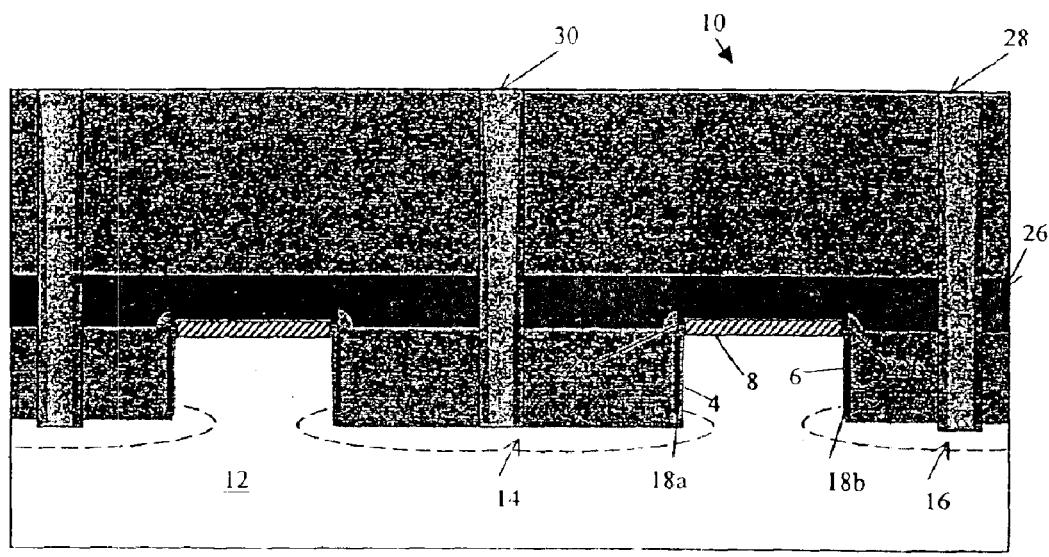
FIG. 1A is a cross-sectional view of a portion of an array of nonvolatile memory cells made by the method of the present invention.

Referring to FIG. 1A, there is shown a cross-sectional view of a portion of an array of nonvolatile memory cells 10 made by the method of the present invention. The cell 10 is similar to the cell shown and described in U.S. Pat. No. 5,029,130, whose disclosure is incorporated herein in its entirety by reference. However, unlike the cell shown and described in U.S. Pat. No. 5,029,130, which has one floating gate and operates in one direction, the cell 10 has two floating gates and as will be seen, operates bidirectionally. The memory cell 10 is formed in a substantially single crystalline semiconductor substrate 12, such as silicon. The substrate 12 is of a first conductivity type, such as P type. The substrate 12 also has a planar surface 8. Within the substrate 12 is a first region 14 of a second conductivity type. A second region 16 of a second conductivity type is spaced apart from the first region 14. Between the first region 14 and the second region 16 is a channel region. Each of the first region 14 and a second region 16, however, lies in a trench in the substrate 12 with a portion of the channel region being a planar surface 8. Each of the trenches has a bottom and a side wall with the first region 14 and the second region 16 being at the bottom of each trench. Thus, the channel region has three portions: a first portion 4 which is along a sidewall of a first trench, a second portion 6 which is along a sidewall of a second trench, and the planar surface portion 8 which is between the first portion 4 and the second portion 6. A first floating gate 18A and a second floating gate 18B are along the side of the sidewalls, 4 and 6, respectively, and spaced apart therefrom and insulated therefrom. Thus, each of the floating gate 18A and 18B controls the conduction of the portions 4 and 6, respectively of the channel region. Further, each cell 10 has a control gate 26. The control gate 26 is substantially parallel to the planar surface 8 and controls the portion 8 of the channel region which is along the planar surface 8. A first contact 30 contacts the first region 14 and a second contact 28 contacts the second region 16. Thus, each of the contacts 30 and 28 extend into the trench. Each of the floating gates 18A and 18B has a tip 22A and 22B respectively which are pointed away from the bottom of the trenches where the first region 14 and second region 16 lie.

Thus, the tips 22A and 22B are adjacent to but spaced apart and insulated from the control gate 26 by a layer of tunneling oxide.

The operation of the cell 10 is as follows.

To program, the first region 14 is held at a small positive voltage such as 3.0 volts, the control gate 26 is at a voltage sufficient to turn on the third portion 8 of the channel region, and the second region 16 is held at a programming voltage such as +12 volts. With the first region 14 at 3.0 volts, the depletion region of the first region 14 would expand through the first portion 4 of the channel region. With the third portion 8 of the channel region being turned on by the control gate 26, and the first portion 4 being turned on, electrons are accelerated as they traverse to the second region 16 and are injected onto the second floating gate 18B through the mechanism of hot channel electron injection similar to the operation described in U.S. Pat. No. 5,029,130. To program the first floating gate 18A, the voltages on the first region 14 and the second region 16 are reversed.

To erase both the first floating gate 18A and the second floating gate 18B, the first region 14 and the second region 16 are held at ground. The control gate 26 is held at a high potential such as +12 volts. In such a case, the electrons stored on the floating gate 18A and 18B are attracted by the high positive potential on the control gate 26 and through the mechanism of Fowler-Nordheim tunneling, they tunnel from the tips 22 of the floating gate 18 through the interpoly oxide to the control gate 26.

To read the cell 10 and to determine if the floating gate 18B is programmed, the second region 16 is held at ground. The control gate line 26 is held at +2 volts sufficient to turn on the third portion 8 of the channel region. A positive potential such as +3 volts is applied to the first region 14. With the first region 14 at +3 volts and the contact 30 at +3 volts, even if the first floating gate 18A were charged, the depletion region would extend to the third portion 8 of the channel region. Conduction of the electrons in the channel region between the first region 14 and the second region 16 would then depend upon the state of the floating gate 18B. If floating gate 18B were erased, then the portion 6 of the channel region adjacent to the second floating gate 18B would conduct and a read current would pass from the first region 14 to the second region 16. If the second floating gate 18B were programmed, then the negatively charged electrons on the second floating gate 18B would prevent a read current from passing between the first region 14 and the second region 16. To read the cell 10 to determine whether the first floating gate 18A is programmed, the voltages applied to the first region 14 and the second region 16 are reversed.

From the foregoing, it is seen that the operation of the cell 10 is similar to the operation of cell disclosed in U.S. Pat. No. 5,029,130, except the cell 10 operates bidirectionally.

Figure 1B:
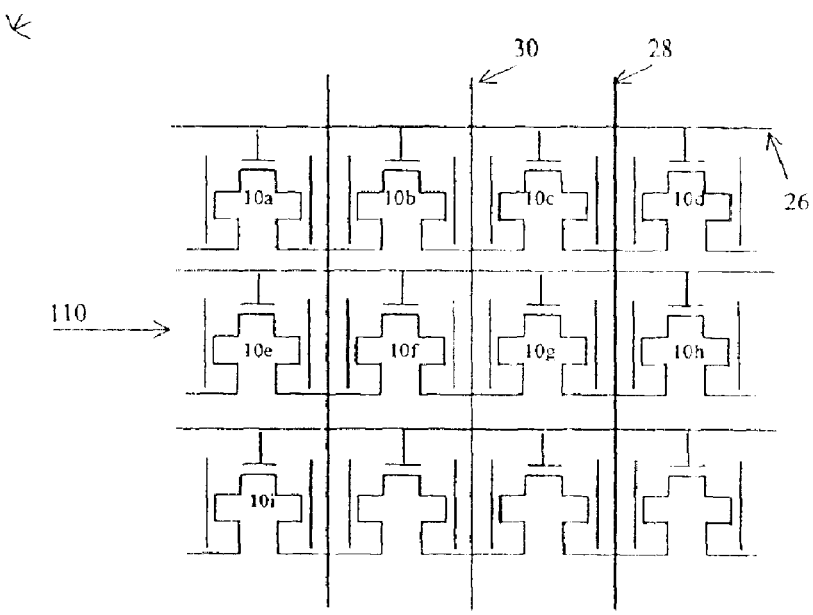
FIG. 1B is a schematic circuit diagram of an array of memory cells made by the method of the present invention.

A schematic view of an array 110 employing a plurality of cells 10 arranged in a plurality of rows and columns is shown in FIG. 1B. The terms "row" and "column" are interchangeable. For the cells 10 that are in the same row such as cells 10A, 10B and 10C, the control gate 26 is connected together. For cells that are in the same column, i.e. cells 10A, 10E and 10I, the contact line 30 connects the first regions 14 together. In addition, the contact line 28 connects the second region 16 together.

Consistent with the foregoing, the voltages applied to the various selected and unselected cells 10 and portions thereof for the operations of program, erase and read for the array 110 are as follows;

|  | Control Gate 24 | | First Region 14 | | Second Region 16 | |
| --- | --- | --- | --- | --- | --- | --- |
|  | Sel | Unused | Sel | Unused | Sel | Unused |
| Erase | +12 v | 0 | 0 | 0 | 0 | 0 |
| Program gate 18a | $V_t$ | 0 | +12 v | 0 | $V_t$ | 0 |
| Program gate 18b | $V_t$ | 0 | $V_t$ | 0 | +12 v | 0 |
| Read gate 18a | $V_t$ | 0 | 0 | 0 | $V_t$ | 0 |
| Read gate 18b | $V_t$ | 0 | $V_t$ | 0 | 0 | 0 |

Figure 2A:
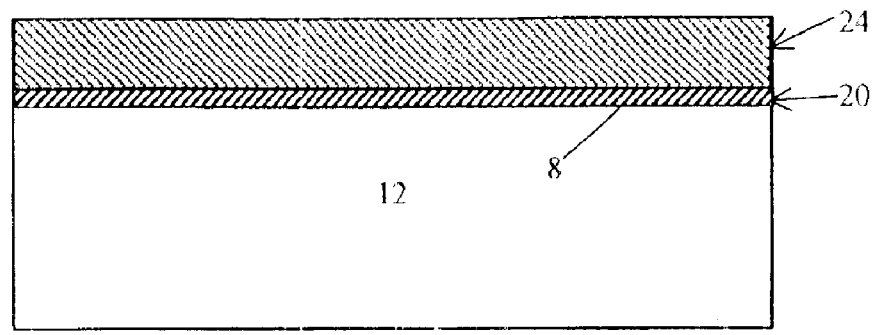
FIGS. 2A–2K are the steps showing the method of the present invention for manufacturing the array of non-volatile memory cells.

A method of manufacturing the cell 10 and the array 110 is as follows. Referring to FIG. 2A there is shown a cross-sectional view of the first step in the process of making the cell 10 and the array 110.

A layer of silicon dioxide ("oxide") 20 is deposited on a first type (typically P type) single crystalline substrate 12. The oxide layer 20 is between 60 and 100 angstroms. This is followed by a deposition of a layer 24 of between 200–300 angstroms of silicon nitride ("nitride"). The resultant structure is shown in FIG. 2A.

Figure 2B:
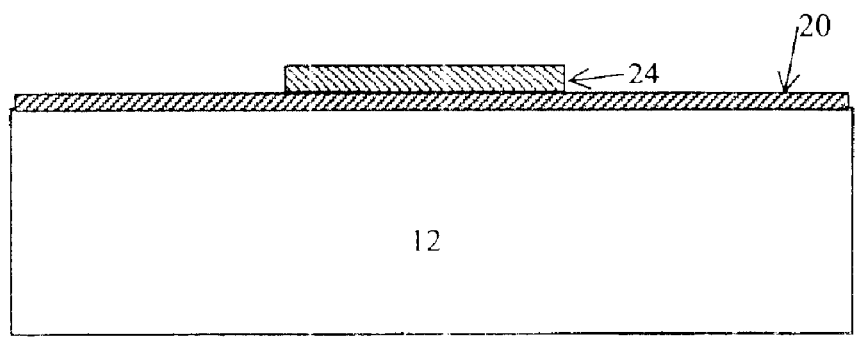

The structure shown in FIG. 2A is then subject to a masking operation in which portions of nitride 24 are masked and the unmasked portions are etched. The resultant structure is shown in FIG. 2B.

Figure 2C:
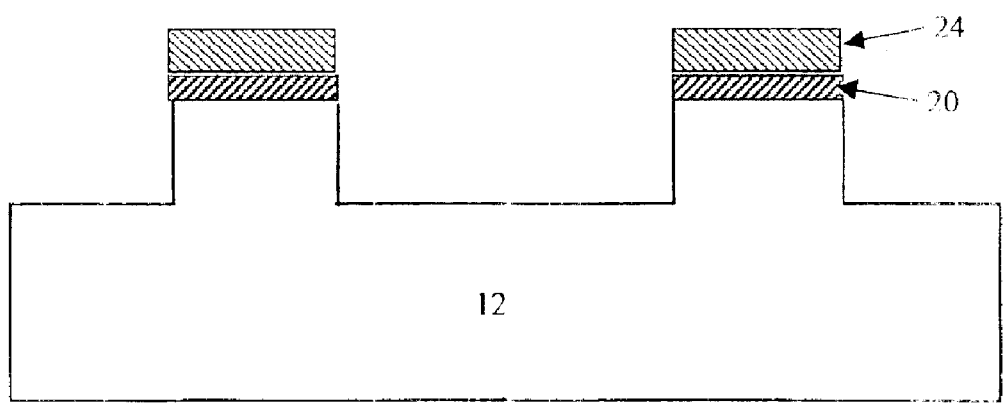

Using the layer 24 of nitride as a mask, the layer of oxide 20 and the underlying silicon substrate 12 are etched forming trenches. Each trench has a bottom and a sidewall. The trench is etched to a depth, such as 300–500 angstroms. The resultant structure is shown in FIG. 2C.

A layer of sacrificial oxide (not shown) is then deposited. This is followed by a shallow N++diffusion implant forming the first region 14 and the second region 16. Although the first and second regions 14 and 16 are shown as being implanted into the substrate 12, they can also be implanted into a well within a substrate 12. The implant can occur at an angle of approximately 0 to 7 degrees, and at approximately 5 to 20 Kev energy. After the implant, the structure is subject to a 950° C. heating for about 15–60 minutes to cause the regions 14 and 16 to diffuse out from the bottom of the trench to wrap around a portion of the sidewall of the trench. The layer of sacrificial oxide is then removed. The resultant structure is shown in FIG. 2D.

Figure 2D:
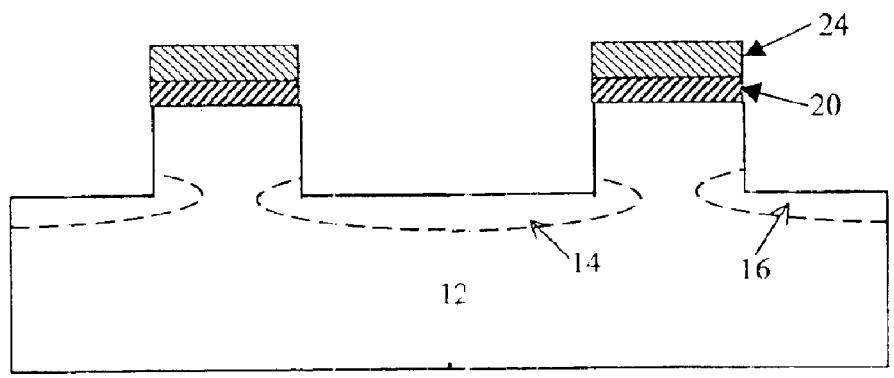
Figure 2E:
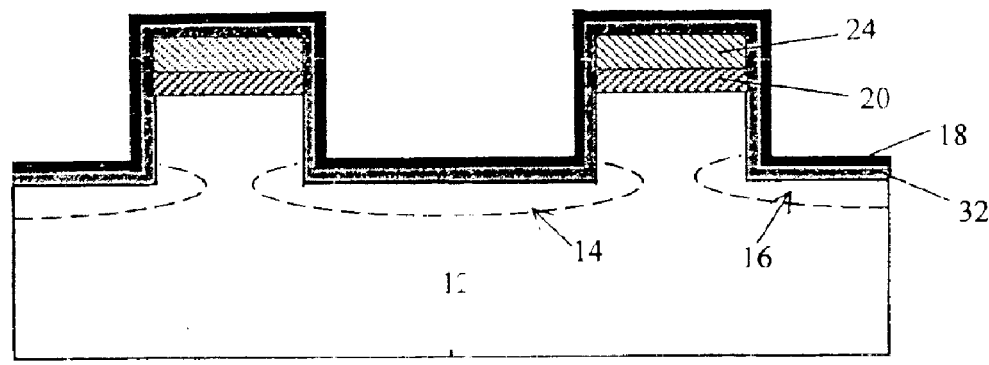

A layer of oxide 32, approximately 80 angstroms thick, is then conformally deposited onto the structure shown in FIG. 2D. This would cover bottom and sidewalls of the trenches, and the oxide 20 and nitride 24. A layer of polysilicon 18 is then conformally deposited on the layer 32 of oxide. The resultant structure is shown in FIG. 2E.

The polysilicon 18 is then anisotropically etched stopping at the oxide layer 32 forming the resultant first floating gate 18A and the second floating gate 18B. Each floating gate 18 has a tip 22. The resultant structure is shown in FIG. 2F.

Figure 2F:
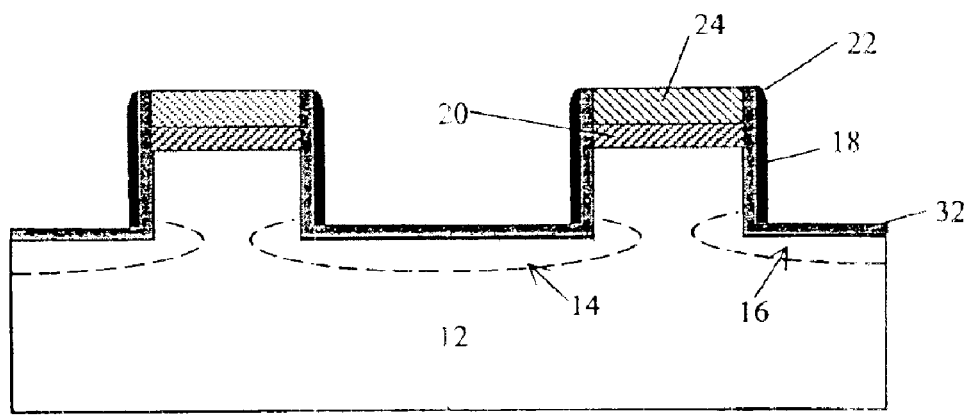
Figure 2G:
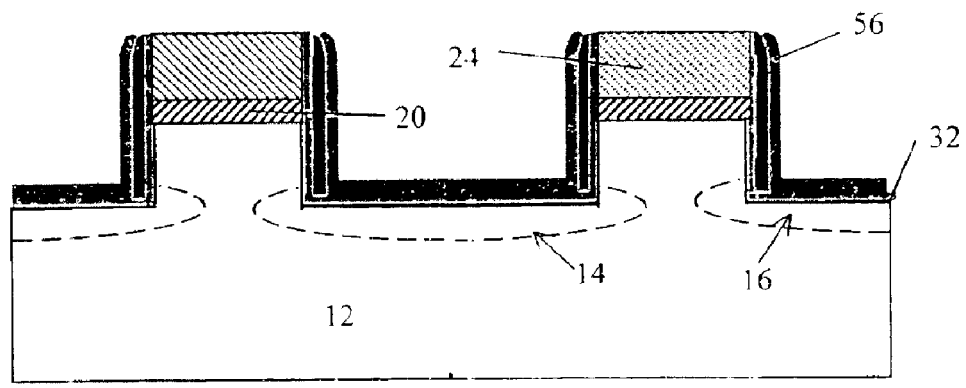

The structure shown in FIG. 2F is then subject to a high temperature oxide deposition step in which a layer 56 of high temperature deposit oxide, approximately 500–1000 angstroms thick, is conformally deposited on the structure shown in FIG. 2F. The structure is then subject to a CMP step stopping on the silicon nitride layer 24. The resultant structure is shown in FIG. 2G.

MOL [what is that] 58, such as BPSG, is then deposited everywhere to a depth of approximately 500–1000 angstroms. The resulting structure is shown in FIG. 2H.

Figure 2H:
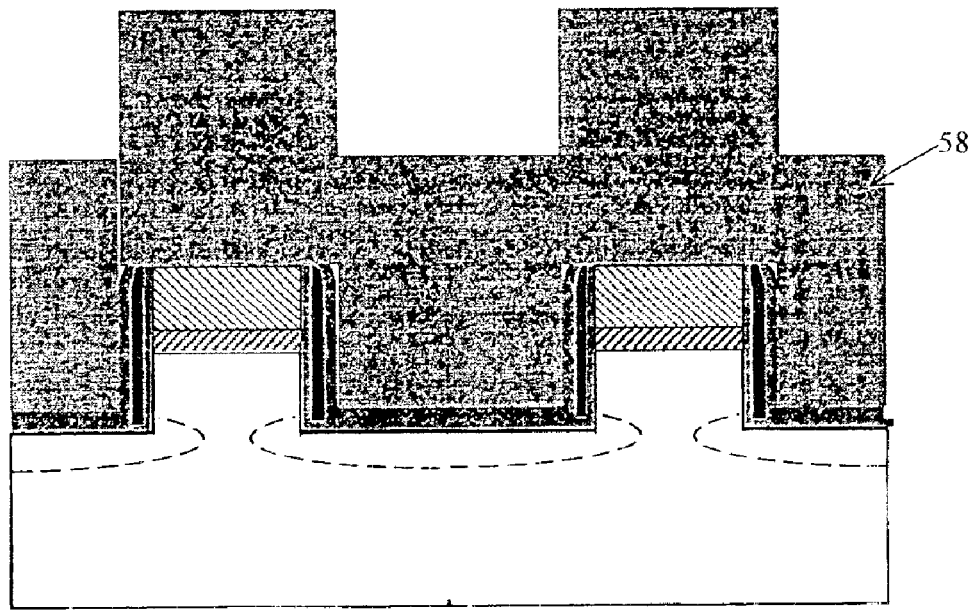
Figure 2I:
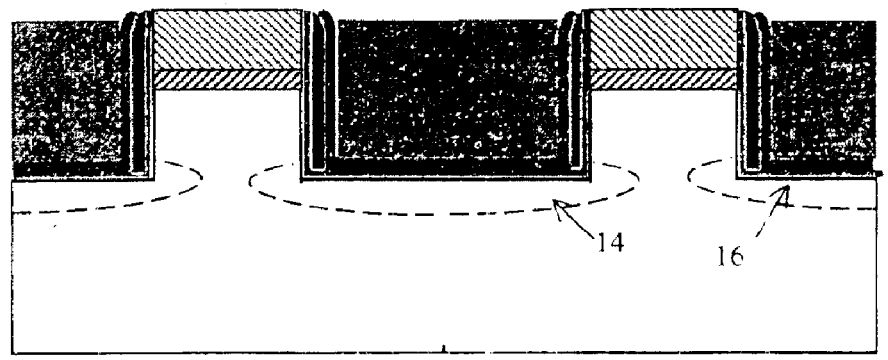

CMP is then applied to the structure shown in FIG. 2H with the silicon nitride layer 24 used as the polished stop. The resultant structure is shown in FIG. 2I.

Figure 2J:
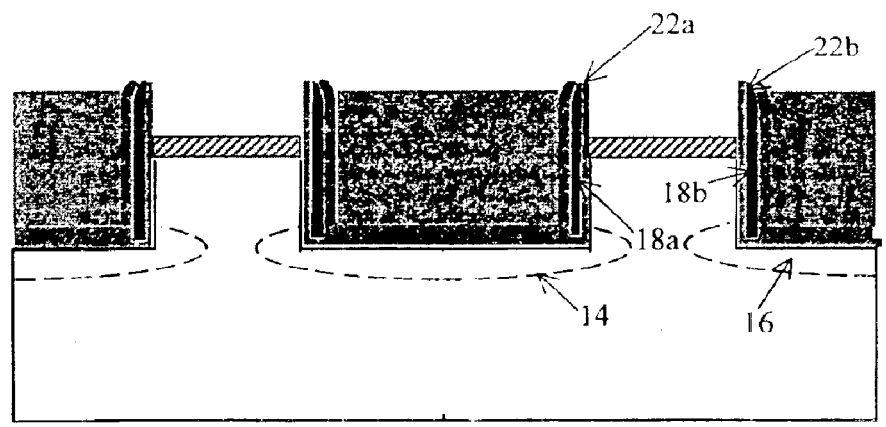

The silicon nitride 24 is then removed by wet etch or dry etch. The resultant structure is shown in FIG. 2J.

A layer 60 of high temperature oxide is then deposited everywhere covering the tips 22A and 22B of the floating gates 18A and 18B respectively. Over the oxide layer 20 however, because the layer 20 was covered by nitride 24 and the removal of the nitride 24 would not have been absolutely complete, the amount of oxide 60 deposited over the layer 20 would only be on the order of 3–10 angstroms. The high temperature oxide 60 is deposited to a depth of approximately 130–210 angstroms. Thereafter, polysilicon 26 to form the control gate 26 is deposited on the tunneling oxide 60 to a thickness of approximately 500–1000 angstroms. The resultant structure is shown in FIG. 2K.

A masking step is then performed. Photoresist is applied to the structure shown in FIG. 2K. Strips of photoresist, parallel to one another lying in planes above and below the paper shown in FIG. 2K are removed by the masking process. Where the photoresist is removed, the polysilicon 26 is anisotropically etched. Further, the oxide 60 is anisotropically etched. Finally, the floating gates 18A and 18B are also etched in the regions where the photoresists are removed, thereby cutting the continuity of the floating gates 18A and 18B. The regions 14 and 16, however, maintain their continuity in a direction substantially perpendicular to the plane of the paper on which FIG. 2K is shown.

Figure 2K:
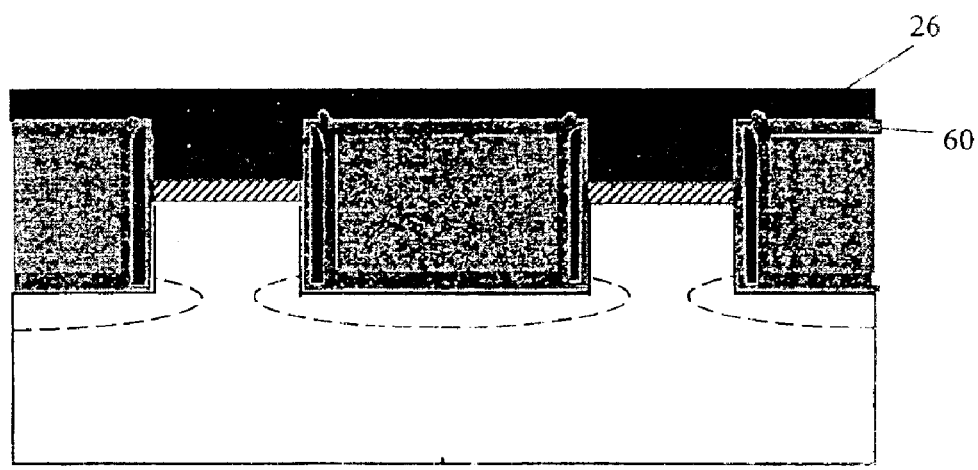

Contacts are then formed to the structure shown in FIG. 2K forming the cross-section view shown in FIG. 1A. As is apparent, adjacent cells 10 share the same either first region contact 30 or the second contact region 28. Further, since the regions 14 and 16 are buried diffusion lines, contacts 28 and 30 need not be made to every cell 10. The contacts 28 and 30 are made only for the purpose of strapping to the regions 14 and 16.

What is claimed is:

1. A method of forming an array of bi-directional non-volatile memory cells in a substrate of a substantially single crystalline semiconductive material having a first conductivity type, said substrate having a substantially planar surface, said method comprising:

forming a plurality of spaced apart substantially parallel trenches in a first direction in said planar surface; each trench having a sidewall and a bottom;

forming a region of a second conductivity type in said bottom of each trench;

forming a floating gate in each trench insulated and spaced apart from said sidewall of said trench; said floating gate having a first end near said bottom and a second end furthest away from said bottom;

forming a layer of tunneling oxide about said second end of each floating gate;

forming a layer of word region on said layer of tunneling oxide; said layer of word region extending in a second direction substantially perpendicular to said first direction;

cutting said layer of word region in a plurality of strips in said second direction to form a plurality of spaced apart word lines; each strip spaced apart from one another and substantially parallel to one another, and cutting through the floating gate in each trench; and forming an electrical connection to each of said region of second conductivity type and each of said plurality of spaced apart word lines.

2. The method of claim 1 further comprising the steps of:

forming a plurality of spaced apart strips of protective material on said planar surface;

using said plurality of spaced apart strips of protective material as mask to form said plurality of spaced apart substantially parallel trenches.

3. The method of claim 2 wherein said protective material is silicon nitride.

4. The method of claim 1 wherein said step of forming a floating gate in each trench further comprises:

depositing a layer of insulating material along said sidewall and bottom of each trench; and conformally depositing a layer of polysilicon on said layer of insulating material;

anisotropically etching said polysilicon to form said floating gate.

5. The method of claim 4 wherein each floating gate is insulated and spaced apart from said bottom of each trench.

6. The method of claim 1 wherein said forming a region step comprises ion implanting dopants of said second conductivity into the bottom of each trench.

* * * * *